US006551126B1

(12) United States Patent
Feldman

(10) Patent No.: US 6,551,126 B1
(45) Date of Patent: Apr. 22, 2003

(54) HIGH BANDWIDTH PROBE ASSEMBLY

(75) Inventor: Steven Feldman, Cedar Park, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 94 days.

(21) Appl. No.: 09/804,762

(22) Filed: Mar. 13, 2001

(51) Int. Cl.[7] .................. H01R 11/18; H01R 13/00; G01R 31/02
(52) U.S. Cl. ........................... 439/482; 324/754
(58) Field of Search .................... 439/482, 101, 439/98, 579; 324/754, 761, 757, 538

(56) References Cited

U.S. PATENT DOCUMENTS

| | | | | |
|---|---|---|---|---|
| 3,852,700 A | * | 12/1974 | Haws ........................... | 439/98 |
| 4,729,752 A | * | 3/1988 | Dawson et al. ............. | 439/620 |
| 6,037,787 A | | 3/2000 | Corwith ....................... | 324/754 |
| 6,066,957 A | | 5/2000 | Van Loan et al. .......... | 324/758 |
| 6,184,460 B1 | * | 2/2001 | Bertoncini ................ | 174/35 R |
| 6,409,550 B1 | * | 6/2002 | Splichal et al. ............. | 439/701 |
| 6,447,328 B1 | * | 9/2002 | Feldman ..................... | 439/482 |

FOREIGN PATENT DOCUMENTS

EP    0 317 191    5/1989

OTHER PUBLICATIONS

Emory Harry, "Automated Probing of High–Speed Analog/Mixed Boards", Electronics Test, vol. 11, No. 6, Jun. 1, 1988, pp. 76–82, San Francisco, CA.

Partial Search Report for PCT/US01/21776.

PCT Search Report PCT/US01/21776 mailed Jul. 18, 2002.

* cited by examiner

Primary Examiner—Lynn D. Feild
Assistant Examiner—Chandrika Prasad
(74) Attorney, Agent, or Firm—Yen Tong Florczak

(57) ABSTRACT

A spring probe block assembly includes an insulative housing. A probe connector having a signal probe, an insulative layer, and a conductive shell is positioned within the housing. At least one ground probe is also positioned within the housing. The ground probe and the conductive shell of the probe connector are electrically connected by a grounding element. The grounding element is configured to elastically deform the ground probe in such a manner as to create spring energy in the ground probe. The spring energy generates a normal force between the ground probe and the grounding element which maintains the ground probe in its position. Also, a method for retaining a spring probe in a housing by elastically deforming the spring probe to maintain a spring force between the spring probe and the housing.

25 Claims, 19 Drawing Sheets

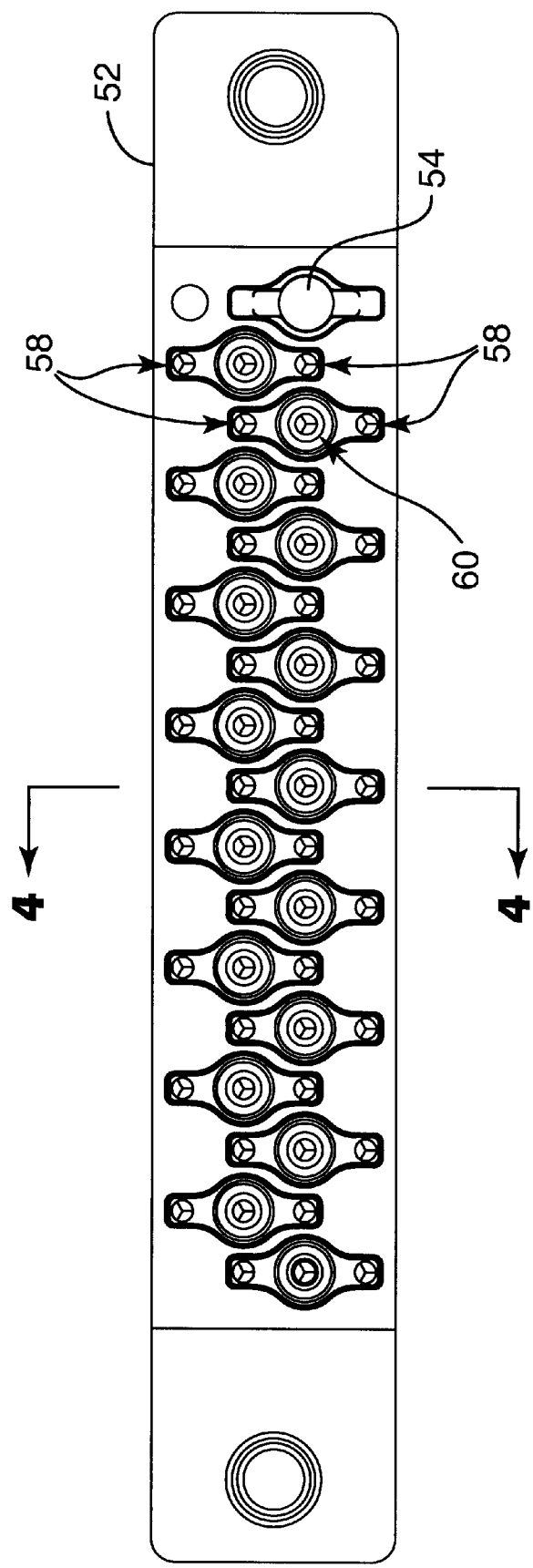

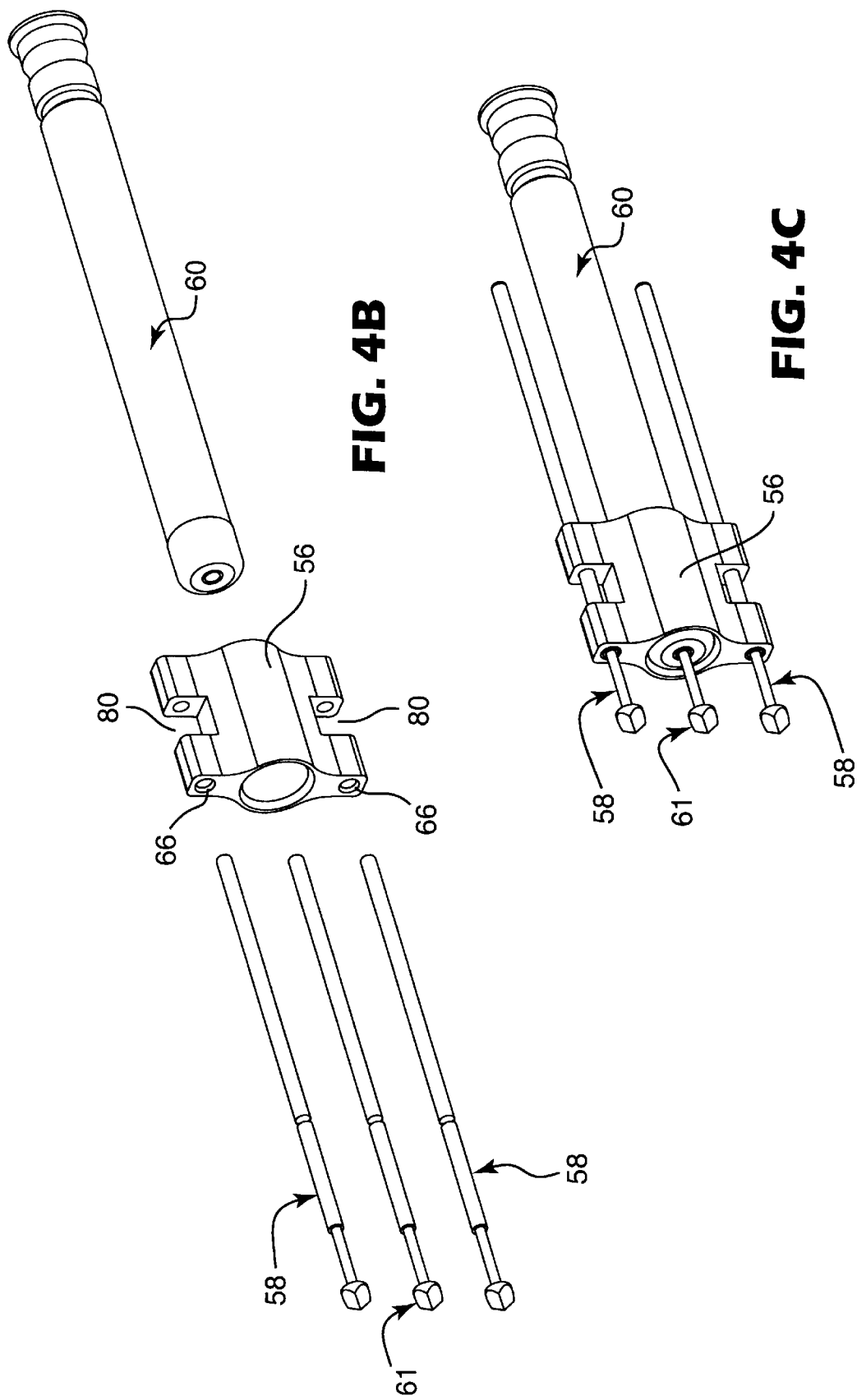

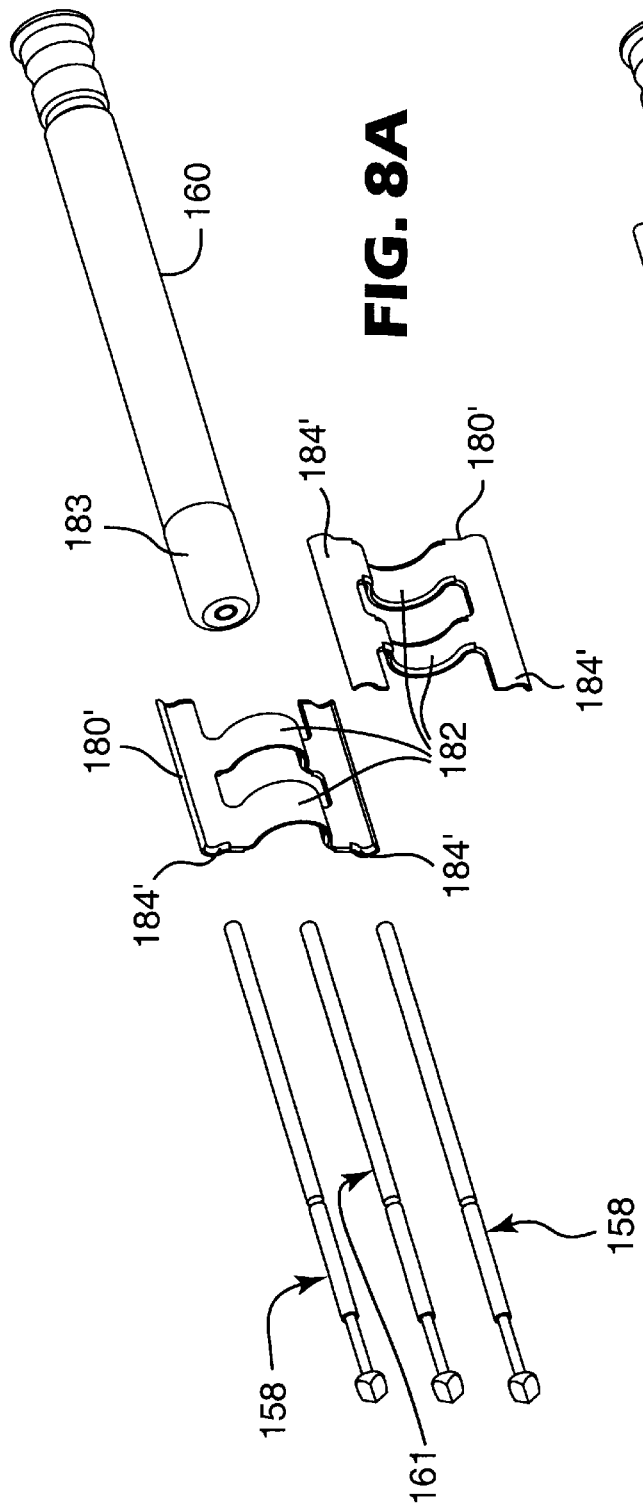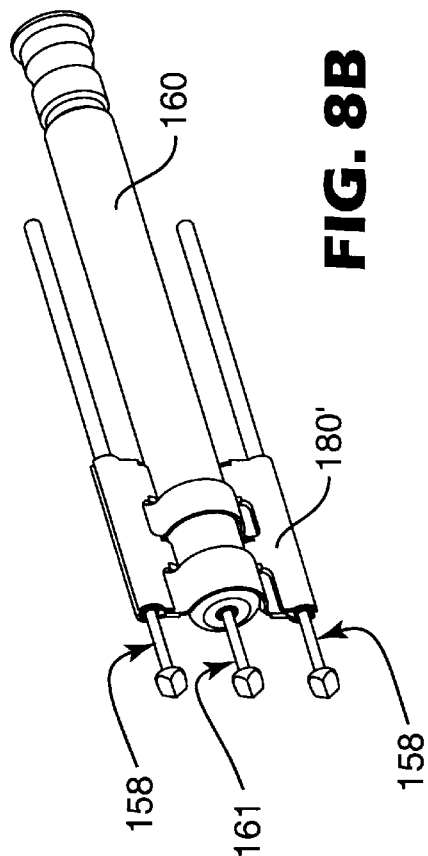
FIG. 8A
FIG. 8B

HIGH BANDWIDTH PROBE ASSEMBLY

BACKGROUND OF THE INVENTION

The present invention relates to spring probe block assemblies of the type used in Automatic Test Equipment (ATE), and specifically to spring probe block assemblies for use in high bandwidth applications.

Spring probe blocks are used to provide temporary spring contact interfaces between integrated circuits or other electronic equipment and the automated test to equipment test head to run necessary tests of integrated circuits or other electronic equipment. Spring probe block assemblies of the type used in automatic test equipment are widely available and use generally similar designs. Spring probe block housings are typically machined from metal bar stock in a costly sequence of processes that assure precise location and diameter of the bores that accept press fitted coaxial probes and ground receptacles. The solid metal fabrication also serves to commonly ground all of the circuit elements, which until recently was considered desirable from a signal integrity perspective. Some spring probe block housings have also been made of a molded polymer instead of a machined metal.

With both the metal and polymer probe block housings, coaxial probe connectors are individually terminated to coaxial cables at one end and to spring probes at the other. Typically, one spring probe is provided for each signal line, and one or more spring probes are provided to serve as a reference (ground) for each signal line. In the case of polymer spring probe housings, coaxial shield tubes and ground spring probes associated with each signal line can be electrically isolated from their neighbors by the dielectric material of the polymer housing. This isolation of each channel (consisting of a signal line plus its associated ground return loop) is necessary to achieve higher bandwidths. The ability to work at high bandwidths is important because the next generation of automated test equipment will be used not only to test faster integrated circuits, but also to test integrated circuits more quickly.

Many currently available spring probe block assemblies are not suitable for use in high bandwidth applications because their designs suffer from one or more infirmities. In particular, many of the prior art spring probe block assemblies (specifically those made using a metal housing) provide a common ground for all of the ground probes. As discussed above, common grounding is not suitable for high bandwidth applications. Rather, for high bandwidth applications it is desired to have the signal probe and its associated ground probes electrically isolated from other coaxial signal and ground probes.

Many of the prior art designs (those using both metal and polymer housings) are also unsuitable for use in high bandwidth applications because of the presence of excessively large ground return loops. FIG. 1A shows a prior art spring probe block assembly 10 that utilizes a polymer housing 12. The ground probes 14 and the signal probe 16 are inserted through holes 18 in the front of the polymer housing 12, with the ground probes 14 being received by box contacts 20. Box contacts 20 are soldered to the coaxial connector 22, which terminates coaxial cable 23 and receives the signal probe 16.

As is illustrated in FIG. 1B, the excessive length of the ground loop (illustrated by dashed line 30) limits the bandwidth because of increased inductance. The ground loop 30 runs from the tip of signal probe 16, through ground probe 14 into box contact 20, along beams 32 of box contact 20, through the weld 34 and then along the conductive shield 36 of the coaxial connector 22. The length of the ground loop is worsened by the thickness of the polymer housing 12 through which the signal and ground probes 16, 14 must pass.

It is well known that at high speeds, the inductance of a given return current path is far more significant than its resistance. In fact, high-speed return currents follow the path of least inductance, not the path of least resistance. Further, it is well know that the lowest inductance return path lies directly under a signal conductor. This means that minimizing the total ground loop length between the outgoing and returning current paths will lead to the lowest possible inductance. Thus, in FIG. 1B, an ideal ground loop is illustrated by dashed line 38. (See High Speed Digital Design: A Handbook of Black Magic by Howard Johnson and Martin Graham).

In addition to the above infirmities, many available designs of spring probe block assemblies require additional components or manufacturing steps to retain the ground spring probe in the assembly. In some instances, tubular receptacles for receiving and retaining the ground spring probes are used. For example, as shown in FIG. 2, in a metal spring probe block housing 40, after a bore 42 is machined into the housing 40 a tubular metal receptacle 44 is press fit into the bore 42, and then the ground spring probe 46 is inserted into the receptacle 44 where it is held in place by a press fit. The receptacle 44 is used to add compliance to the system and avoid damage to the ground spring probe 46, because the ground spring probe 46 itself has very little compliance. The use of probe receptacles 44 adds the undesirable requirements of additional assembly steps and additional parts to be inventoried. In other instances where a tubular receptacle is not used, the ground spring probe is manufactured with what is referred to as a "banana bend". The banana bend allows the ground spring probe to be inserted into an oversized bore and retained within the bore by a frictional fit. However, manufacturing a spring probe with a banana bend is difficult and costly, and requires that different types of spring probes be used for the signal and ground lines. Clearly, the added manufacturing difficulty and cost, as well as the increased inventory is undesirable. In both of the above described situations, replacing a damaged ground spring probe if very difficult without damaging the remainder of the assembly.

Clearly, what is needed is a spring probe block assembly that can provide a cost effective approach for providing electrically stable, low inductance paths between coaxial connectors and their ground probes. Preferably, such a spring probe block assembly would eliminate the need for ground probe receptacles (and their associated cost, assembly labor, and longer impedance path). In addition, the spring probe block assembly would not require the used of a ground spring probe having a banana bend when no ground probe receptacle is used. Preferably, the spring probe block assembly would also facilitate the replacement of spring probes and coaxial connectors within the block assembly without requiring extensive rework or even scrapping of the entire spring probe block assembly. In addition, the spring probe block assembly would preferably be resistant to high cable pullout forces that could inadvertently dislodge the coaxial connectors during motion of the automated test equipment.

BRIEF DESCRIPTION OF THE DRAWINGS

FIG. 3B is an elevational view of the front face of the spring probe block assembly of FIG. 3A;

FIGS. 4B and 4C are explodes and assembled views, respectively, of the ground plate, probe connector and ground probes shown in FIG. 4A.

FIGS. 8A and 8B are perspective views of an alternate embodiment of the conductive retainer element of the spring probe block assembly described herein;

SUMMARY OF THE INVENTION

Figure 1A:
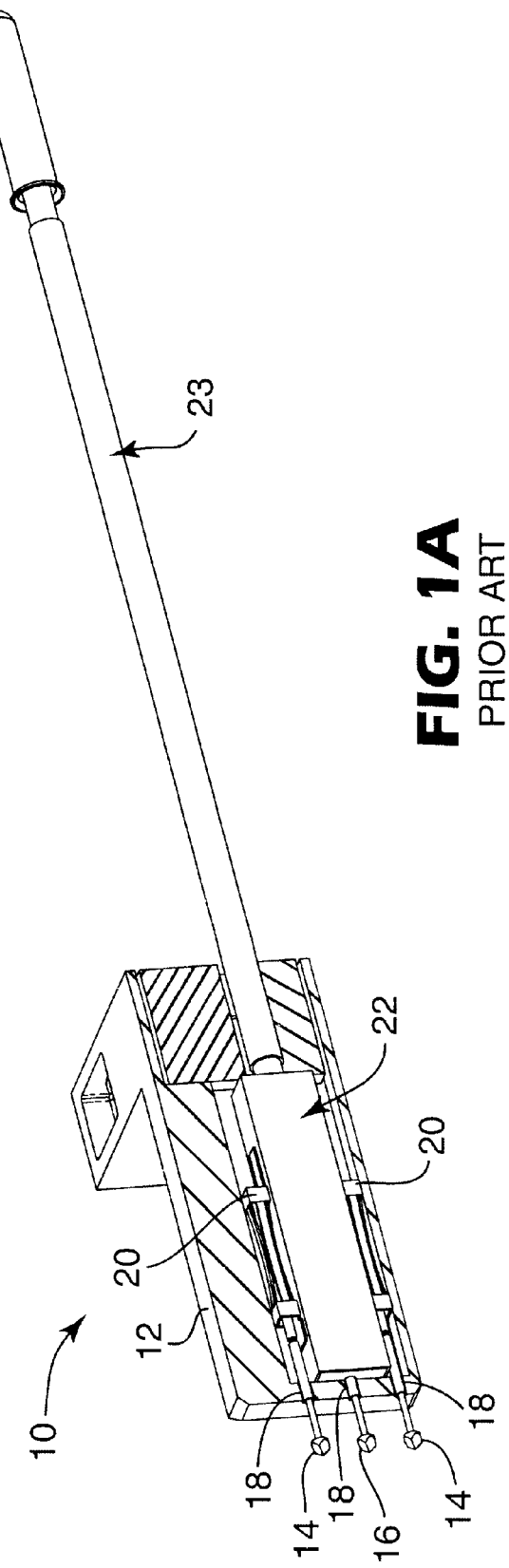
FIG. 1A is a cross-sectional view of a prior art spring probe block assembly.
Figure 1B:
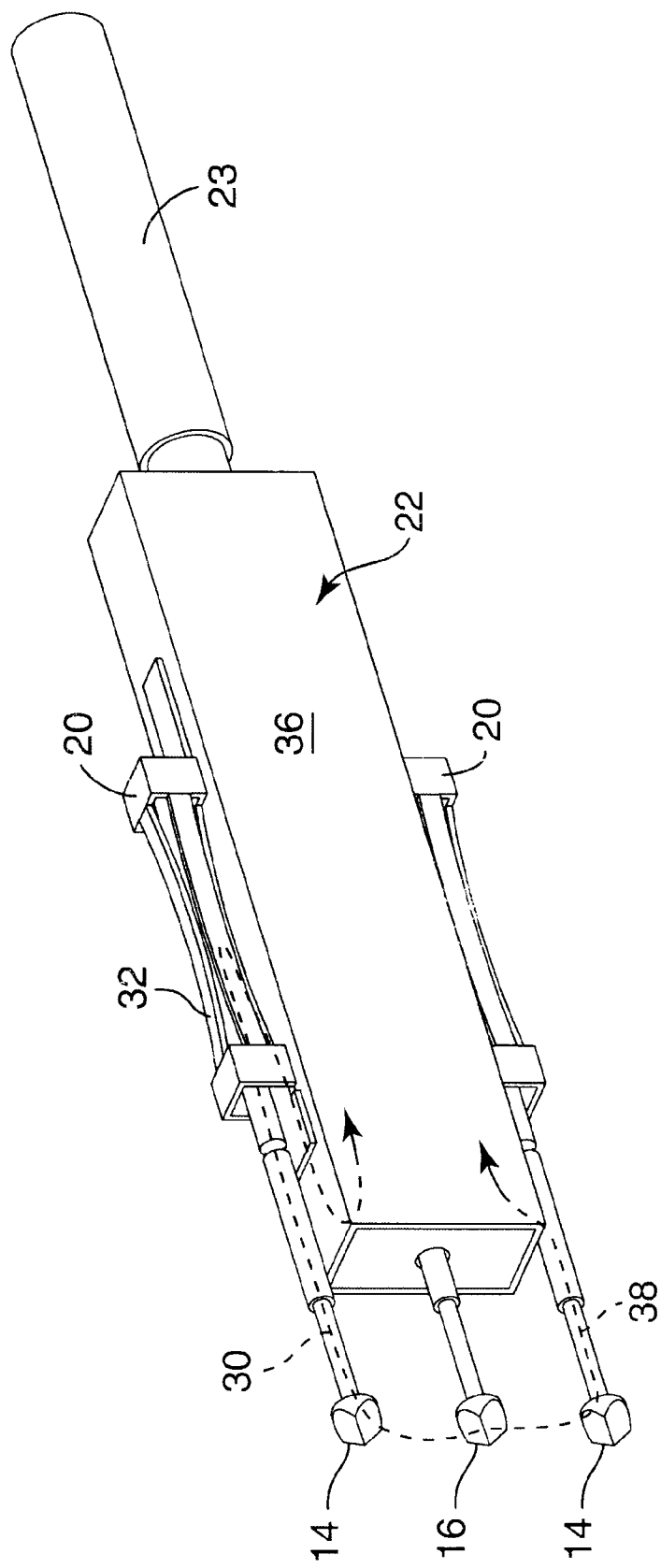
FIG. 1B is a greatly enlarged perspective view of the probe connector and ground probe assembly of the spring probe block assembly of FIG. 1A.
Figure 2:
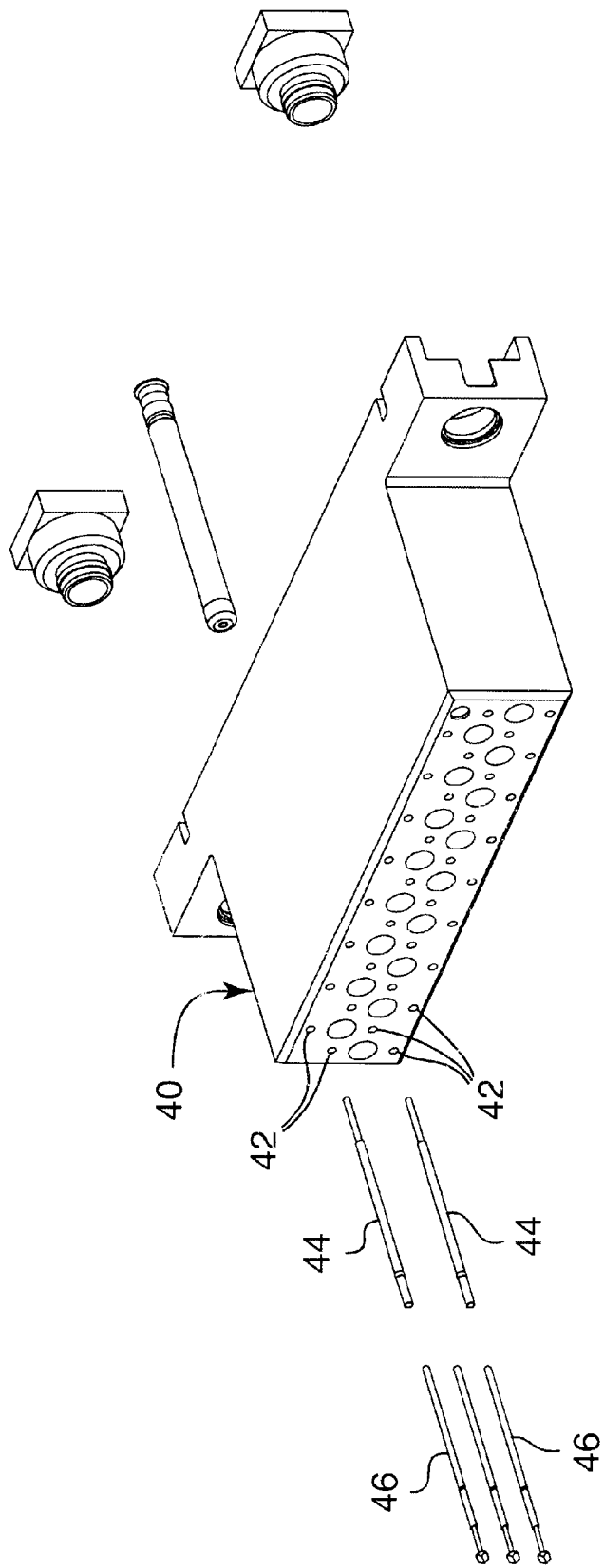
FIG. 2 is a perspective view of another prior art spring probe block assembly.

The present invention is a spring probe block assembly for use in high bandwidth applications. The spring probe block assembly described herein electrically isolates the signal probe and its associated ground probes from other coaxial signal and ground probes, and provides a low inductance return path for the signal. The spring probe block assembly also eliminates the need for ground receptacles or spring probes which utilize a banana bend.

In a preferred embodiment, the spring probe block assembly comprises an insulative housing having a cavity in a front face of the housing. A conductive retainer is positioned in the cavity adjacent the front face of the housing. The conductive retainer has passages for receiving the probe connector and the ground probes. The conductive retainer electrically connects the ground probe and the conductive shell of the signal probe connector to provide a low inductance ground return path for the associated signal. Preferably, the housing of the spring probe block assembly is formed of a dielectric insulative material which has either anti-static or static dissipative properties.

In one embodiment, the ground probes are retained within the conductive retainer by a normal force which is generated when the ground probe is inserted into the retainer. The normal force is generated as the ground probe is deflected by a ramped sidewall within the housing. As the ground probe is deflected by the ramped sidewall, the ground probe is frictionally retained in the assembly. In another embodiment, the insertion of the ground probe into the retainer causes a clamping force to be generated on the probe connector body, thereby retaining the probe connector, retainer, and ground probes in a fixed relationship.

An additional aspect of the invention is a grounding element for electrically connecting a ground probe with a cable shield of a signal probe connector, wherein the ground probe is elastically deformed by the grounding element to maintain a spring force between the grounding element and the ground probe. The elastic deformation of the grounding element may be created, for example, by providing a bore having a non-linear axis into which the ground probe is inserted. As the ground probe is inserted into the bore having a non-linear axis, elastic deformation of the ground probe causes a spring force to be created and thereby retain the ground probe in position.

Yet another aspect of the invention is a method for retaining a spring probe in a housing. The method comprises forming a bore having a non-linear axis in the housing, and then inserting a linear spring probe into the bore. By inserting the linear spring probe into the non-linear bore, the spring probe is elastically deformed and maintains a spring force between the housing and the spring probe, thereby maintaining the spring probe in its position.

DETAILED DESCRIPTION OF THE INVENTION

The present invention provides a cost effective approach for creating electrically stable, low inductance paths between coaxial connectors and their ground probes when used in spring probe block assemblies. The spring probe block assembly described herein allows easy replacement of components of the spring probe block assembly, without requiring extensive rework or scrapping of parts. Further, the design is resistant to inadvertent dislodging of the coaxial connectors when they are subject to high cable pullout forces during use.

Figure 3A:
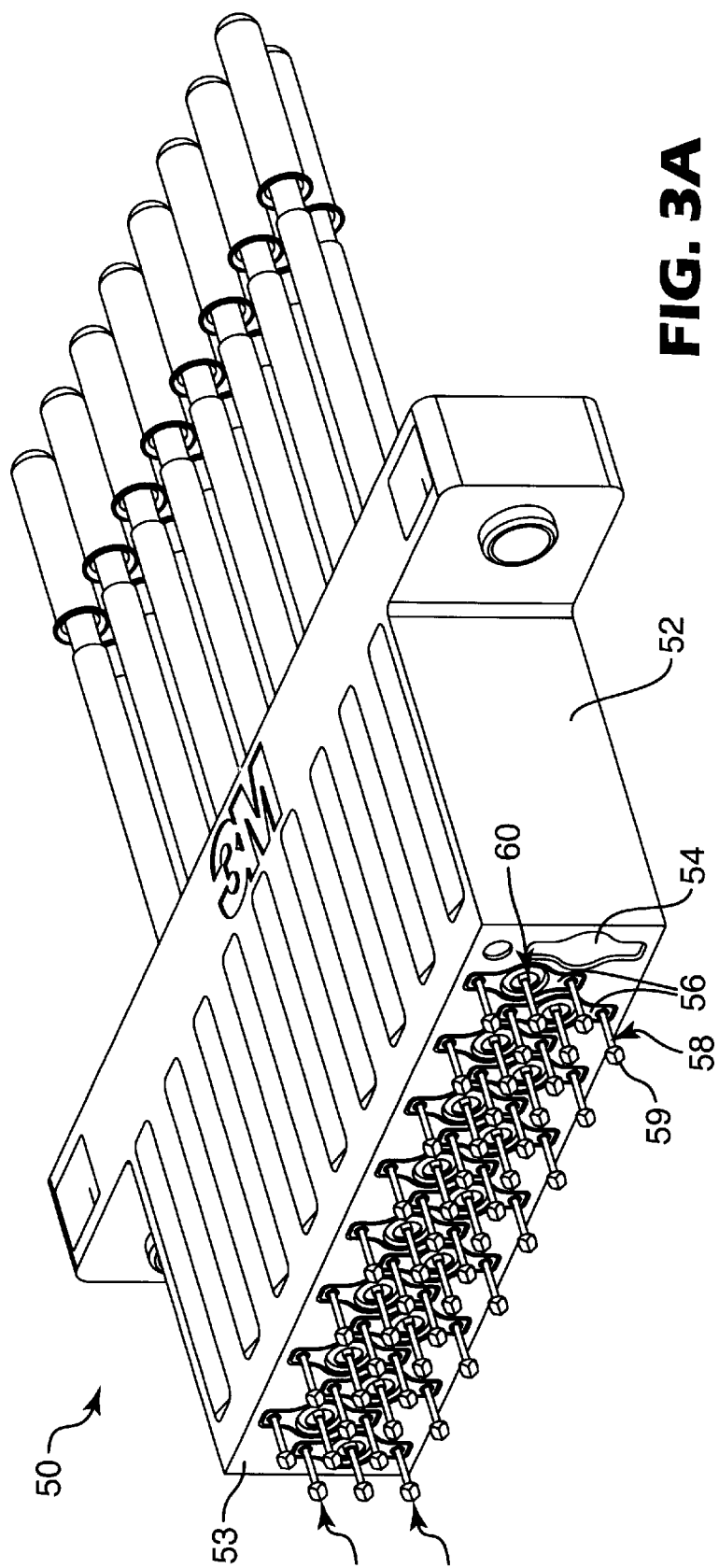
FIG. 3A is a perspective view of one embodiment of the inventive spring probe block assembly described herein.
Figure 3C:
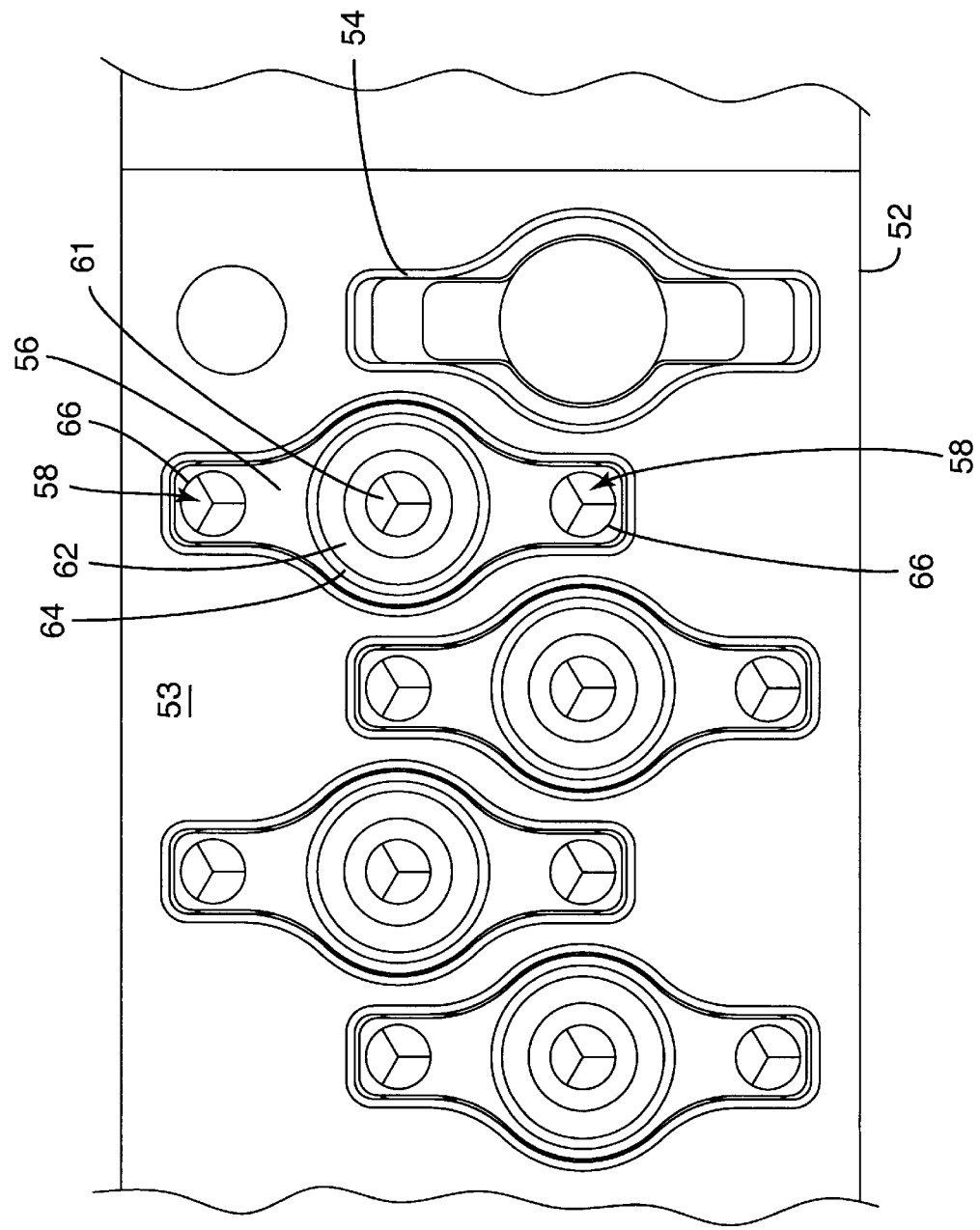
FIG. 3C is a greatly enlarged view of a portion of the front face of the spring probe block assembly of FIG. 3A.

FIG. 3A provides a perspective view of one preferred embodiment of the spring probe block assembly described herein. As seen in FIG. 3A, spring probe block assembly 50 includes a housing 52 which is formed, such as by injection molding, from a suitable insulative polymer material, such as glass fiber reinforced polyphtalarnide (PPA). In some intended applications of the probe block assembly, it may be preferred to use polymer materials that have anti-static properties, such as carbon fiber reinforced polyphtalamide. The housing 52 includes in its front face 53 cavities 54 which are shaped to receive ground plates 56 in a slip or press fit manner. The ground plates 56 are designed to receive and retain both ground spring probes 58 and probe connector 60. As can be seen more clearly in FIGS. 3B and 3C, the probe connector 60 includes signal spring probe 61 which is surrounded by dielectric insulation 62 and then a conductive shield 64. The signal probe 61 is thus isolated from ground. The conductive shield 64 of the probe connector 60 is in intimate contact with the ground plate 56. Ground spring probes 58 are slidably received within openings 66 in the ground plate 56 and make contact with the ground plate 56 in a manner further described below. As can be seen, the dielectric material housing 52 surrounds and isolates the ground elements (ground plate 56 and ground spring probes 58) and their associated signal line from every other ground and signal line pairing. All grounds in the assembly are also insulated from other probe block assemblies which may be adjacent, as well as from the automated test equipment chassis ground.

Figure 4A:
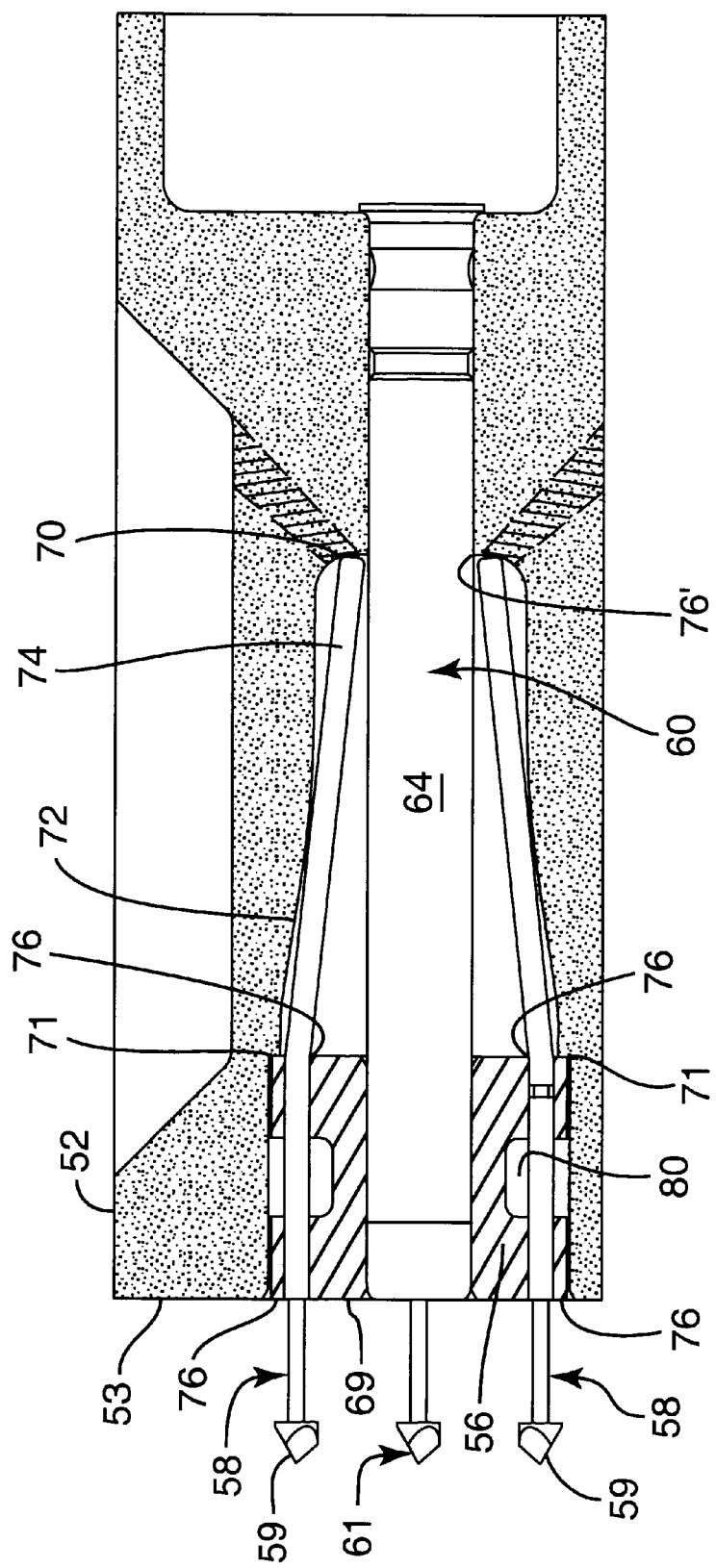
FIG. 4A is a cross-sectional view taken along line 4—4 of FIG. 3B.

FIG. 4A shows a greatly enlarged cross-sectional view of the spring probe block assembly 50 with a single coaxial probe connector 60 and its associated signal and ground probes 61, 58, respectively. For additional clarity, FIGS. 4B and 4C illustrate exploded and assembled views, respectively, of ground plate 56, ground spring probes 58 and probe connector 60. As can be seen in FIG. 4A, the cavity 54 extends into the housing 52 and conforms to the general envelope of an assembled set of grounding elements, with the cavity 54 dimensioned in such a manner as to constrain the axial and lateral movement of the assembled probe connector 60, ground plate 56 and spring probes 58, 61. In particular, the ground plates 56 each have an opening 68 sized to receive conductive shield 64 of probe connector 60 and retain it by press-fit, where the interference between the probe connector 60 and the opening 58 in ground plate 56 preferably results in elastic deformation of the ground plate 56. Permitting elastic deformation of the ground plate 56 is preferred because probe connector 60 has very little compliance, and making the ground plate 56 compliant effectively doubles the number of compliant members from one to two. This permits the use of less stringent tolerances in the components, and therefore increases the manufacturability of the probe block assembly 50.

As discussed above, in high bandwidth applications it is desired to provide a low inductance ground return path in the probe assembly. Thus, it is preferred to position the ground plates 56 as far forward as possible in the housing 52 such that the ground return path is shortened and maintained in close proximity to the signal path. Therefore, in a preferred embodiment, the ground plates 56 are seated in housing 52 such that the front faces 69 of the ground plates 56 are flush with the front face 53 of housing 52. Alternately, front faces 69 of ground plates 56 may protrude slightly forward of front face 53 of housing 52. The seating depth of ground plates 56 may be controlled by the position of shoulders 71 in the cavity 54.

The ground plates 56 are preferably symmetrical so they may be inserted into the cavities 54 in the housing 52 without requiring a specific orientation. In addition, the ground plates 56 preferably have a thickness sufficient to prevent significant bending of the ground spring probe bodies 74 in the area of the spring probe plunger travel when the ground spring probe body 74 is deformed by contact with the ramped side wall 72 of the housing 52. In a preferred design, the ground plates 56 are provided with open channels 80 which bisect the ground spring probe thru-holes 66 to enhance flow of plating process fluids through the holes 66 during the manufacturing process. The ground spring probe thru-holes 66 are preferably spaced to compensate for the angular displacement of the ground spring probe tips 59 when the ground spring probe bodies are displaced by bending against the ramped side wall 72 of the housing 52 when they are inserted into the assembly. Further, the ground spring probe tips 59 are preferably disposed at an angle with respect to the axis of the signal probe connector 60 at an angle of 3 degrees or less to minimize the internal contact resistance within ground spring probe 58 and to avoid increasing wear during prolonged cycling of the assembly.

As noted above, the ground plates 56 have at least one thru-hole 66 sized to allow the slip-fit passage of a ground spring probe 58. The ground spring probes 58 seat against an end wall 70 of the cavity 54 in the housing 52. Preferably, the cavity 54 in housing 52 includes a ramped side wall 72 which progressively interferes with the ground spring probe body 74 during its insertion so that the interference between the ground spring probe body 74 and the ramped side wall 72 elastically deforms the ground spring probe body 74, as seen in FIG. 4A. The interference between the ground spring probe body 74 and the ramped side wall 72 maintains a normal force between the ground spring probe body 74 and the ground plate 56 at two points 76. An optional third point of contact 76' may be obtained by increasing the slope of the ramped side wall 72 to force the end of the ground spring probe body 74 against the signal probe connector body shield 64.

Figure 5A:
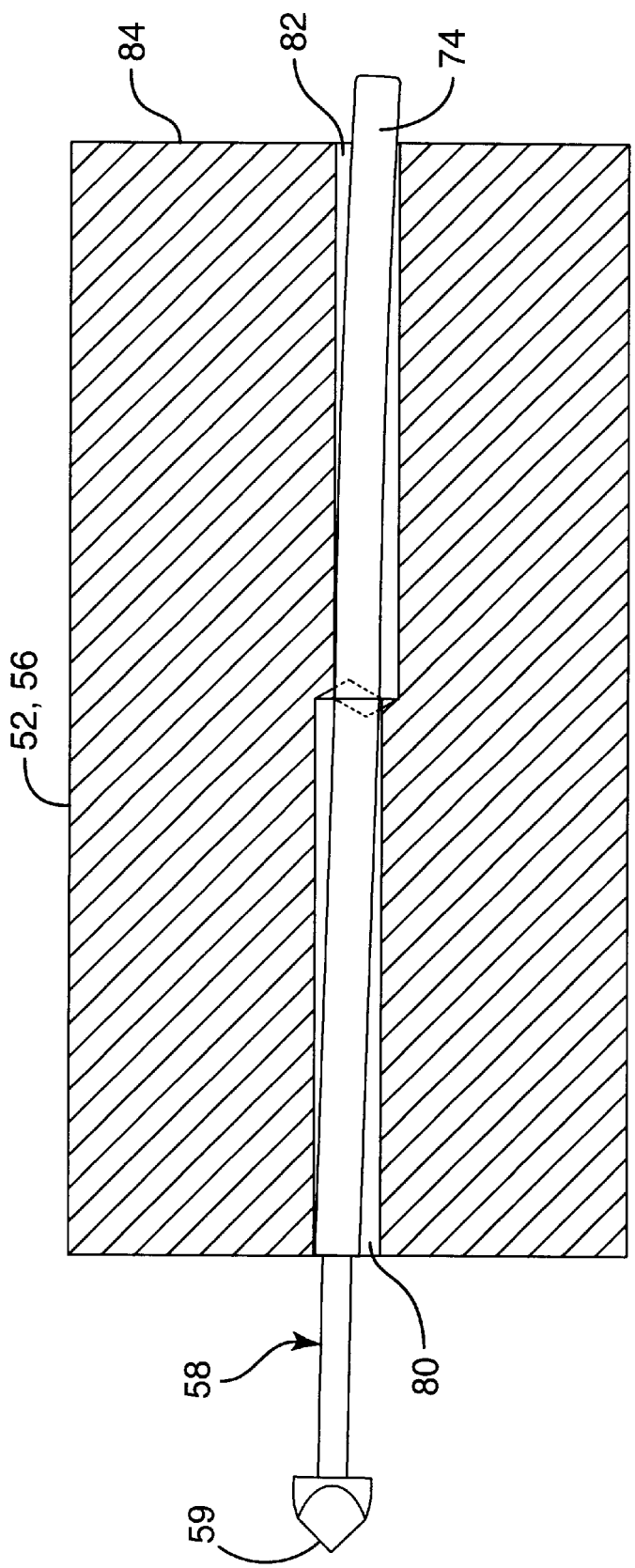
FIGS. 5A–5C are cross-sectional illustrations of alternate spring probe retention configurations.
Figure 5B:
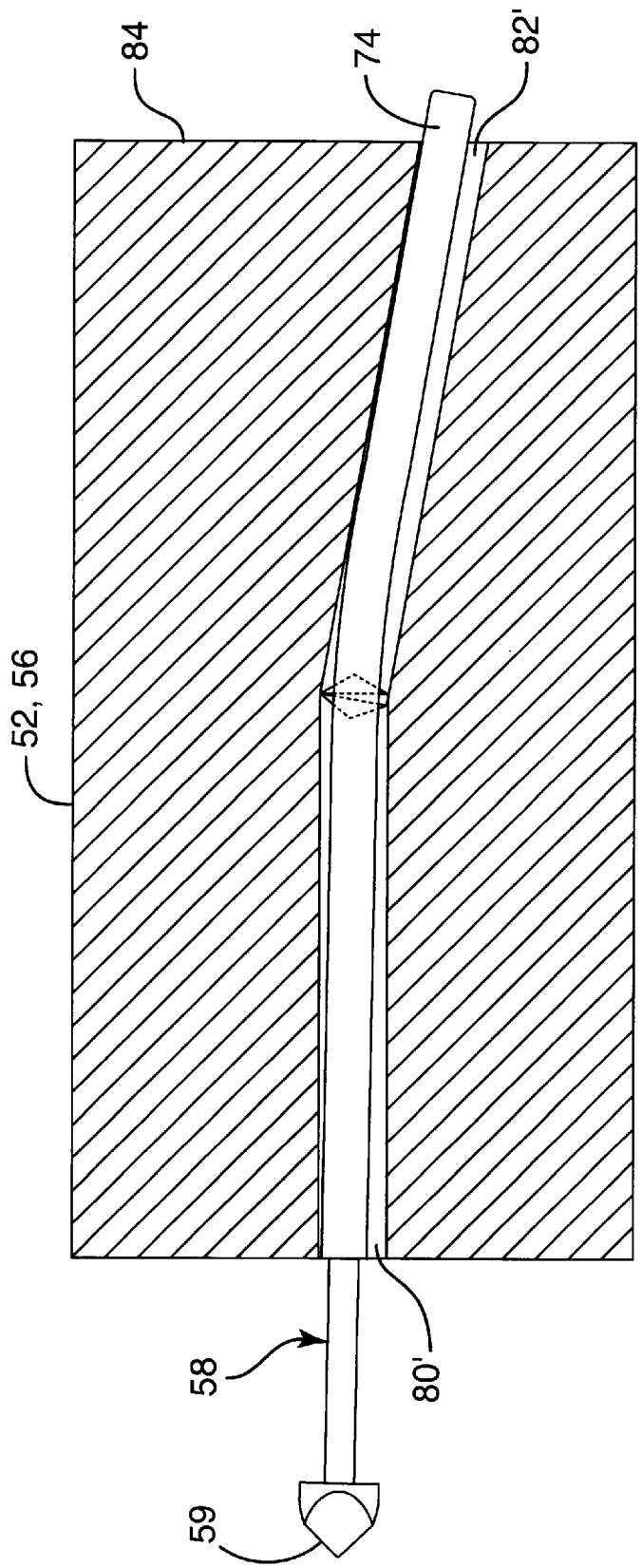
Figure 5C:
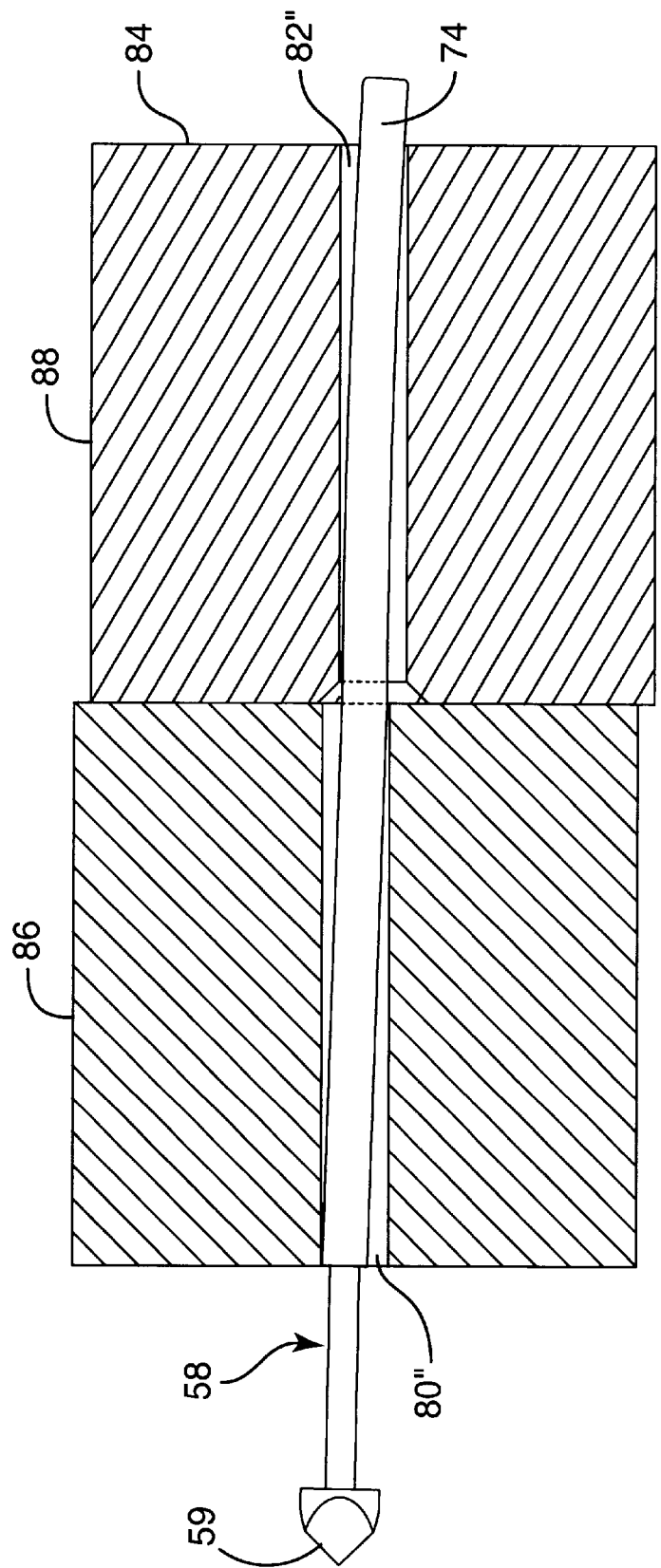

Ground spring probe body 74 may be deflected and retained within ground plate 56 by means other than contact with ramped side wall 72 as described above. Specifically, ground plate 56 may be provided with bore geometry for maintaining a normal force against the ground spring probe 58 without the use of ramped side wall 72 in housing 52. As illustrated in FIG. 5A, ground plate 56 may have a first bore 80 extending from front face 200, and a second bore 82 extending from back face 201, where first and second bores 80, 82 are slightly offset from each other. As ground spring probe body 74 is inserted from front face 200 into first bore 80 and then into second bore 82, ground spring probe body 74 is deflected, causing ground spring probe body to exert a normal force against ground plate 56 and thereby be held in place by a frictional fit. As illustrated in FIG. 5B, ground plate 56 may alternately have first bore 80' extending from front face 200, and a second bore 82' extending from back face 201, where second bore 82' is positioned at an angle relative to first bore 80. As described above, when ground spring probe body 74 is inserted from front face 200 into first bore 80' and then into second bore 82', ground spring probe body 74 is deflected, a normal force results, and ground spring probe body 74 is held by a frictional fit. As illustrated in FIG. 5C, ground plate 56 may optionally be formed from a front portion 86 and a back portion 88, where a first bore 80" extends through front portion 86 from front face 200, and a second bore 82" extends through back portion 80 from back face 201. When assembled in the housing 52, front and back portions 86, 88, respectively of the ground plate are aligned such that first and second bores 80", 82" are slightly offset from each other. Again, as ground spring probe body 74 is inserted from front face 200 into first bore 80" and then into second bore 82", ground spring probe body 74 is deflected, a normal force is generated, and ground spring probe body 74 is held by a frictional fit.

It will be recognized that the designs illustrated in FIGS. 5A–5C may also be used in probe assemblies that have metal housings and that do not use ground plates or retainers as described above. Specifically, the spring probe retention methods illustrated in FIGS. 5A–5C may be used in metal housings to secure ground probes in the housing without the use of receptacles or the need for pre-formed "banana-bends" in the ground probes. Those skilled in the art will recognize that eliminating the need for receptacles or pre-formed banana-bends simplifies manufacturability and reduces the cost of the probe assemblies, and is therefore highly desirable.

Additional features may be provided to the spring probe block assembly. For example, the housing 52 may be provided with access holes 90 which communicate with the ground probe body seats 70 to allow a tool (not shown) access to the back of the ground spring probe bodies 74. Such tool access would facilitate ground spring probe removal, such as when a spring plunger breaks during use. Optional access holes 90 would be sealed when used in applications requiring vacuum sealing of the device. Vacuum sealing may be accomplished by providing a removable plug for filling access holes 90.

Figure 6A:
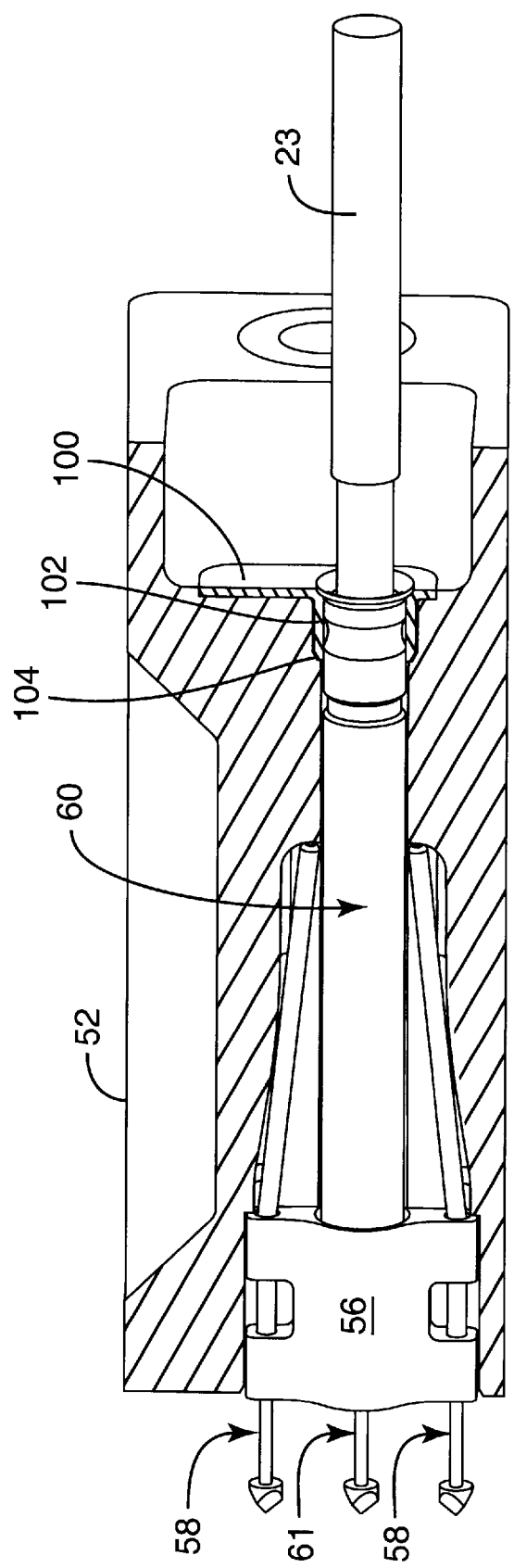
FIG. 6A is a cross-sectional view of a spring probe block assembly having optional vacuum sealing.
Figure 6B:
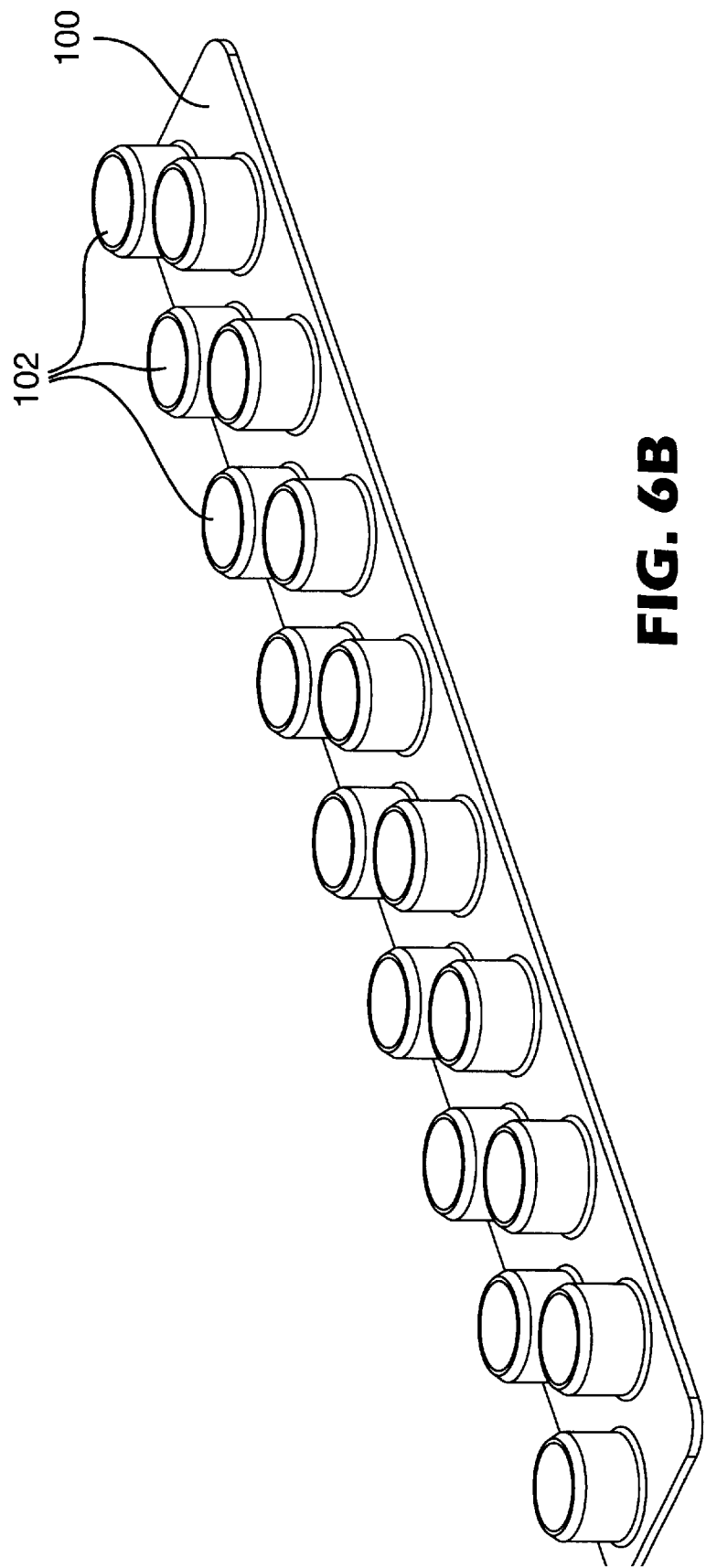
FIG. 6B is a perspective view of a molded insert for providing optional vacuum sealing.

If vacuum sealing of a device is desired, optional sealing capabilities may also be provided within the bore 104 of cavities 54, such as shown in FIGS. 6A and 6B. The sealing capabilities are preferably provided by a single molded insert 100 of pliable polymer that includes a collar portion 102 designed to fit within the bore 104 of the cavity at the back face of housing 52. As seen in FIG. 6A, when the probe connector 60 is inserted into the housing 52, the probe connector 60 would press the collar 102 of compliant insert 100 against the walls of bore 104 and thereby provide a reliable seal. In addition to the single molded insert 100 shown in FIGS. 6A and 6B, it would also be possible to provide individual collars or o-rings within each of the bores 104 of the cavity 52 to provide sealing. However, the use of individual o-rings would greatly increase the assembly time of the device, as well as be more easily displaced during insertion of the probe connector 60.

In the spring probe block assembly 50 described herein, the distance from the front face 53 of the housing 52 to the ground spring probe contact point 76 in the housing 52 is minimized and is close to zero. That is, the ground spring probe body 74 contacts the ground plate 56 as close to the front face 53 of the housing as is possible, thereby resulting in a very low inductance ground path. As discussed above, a low inductance ground path is highly desired, and in fact required, for many high bandwidth applications. The prior art spring probe block assemblies utilize much longer electrical paths, and therefore have higher self inductance, rendering them unsuitable for high speed testing capabilities.

The above described spring probe block assembly also has the advantage of being easy to assemble, rework and repair. Because the polymer housing described herein utilizes compliant members to hold the spring probe bodies in place and in electrical contact with each other, it is easy to assemble the spring probe block assembly or to replace those parts that may be worn out or broken. Thus, the spring probe block assembly described herein not only eliminates parts which must be discarded when damaged during the assembly process, it also allows relatively inexpensive parts to be replaced, rather than requiring the entire assembly to be discarded.

In applications where it is required that the spring probe block assembly must be sealed against a vacuum, the present invention allows effective sealing by locating sealing rings as described above in each housing cavity around each probe connector 60. The sealing compression is maintained by the spatial relationships among the components. Sealing around the ground probes 58 is not required, because the housing 52 allows the vacuum seal to be placed behind the position of the ground probes 58.

Alternate Embodiment

Figure 7A:
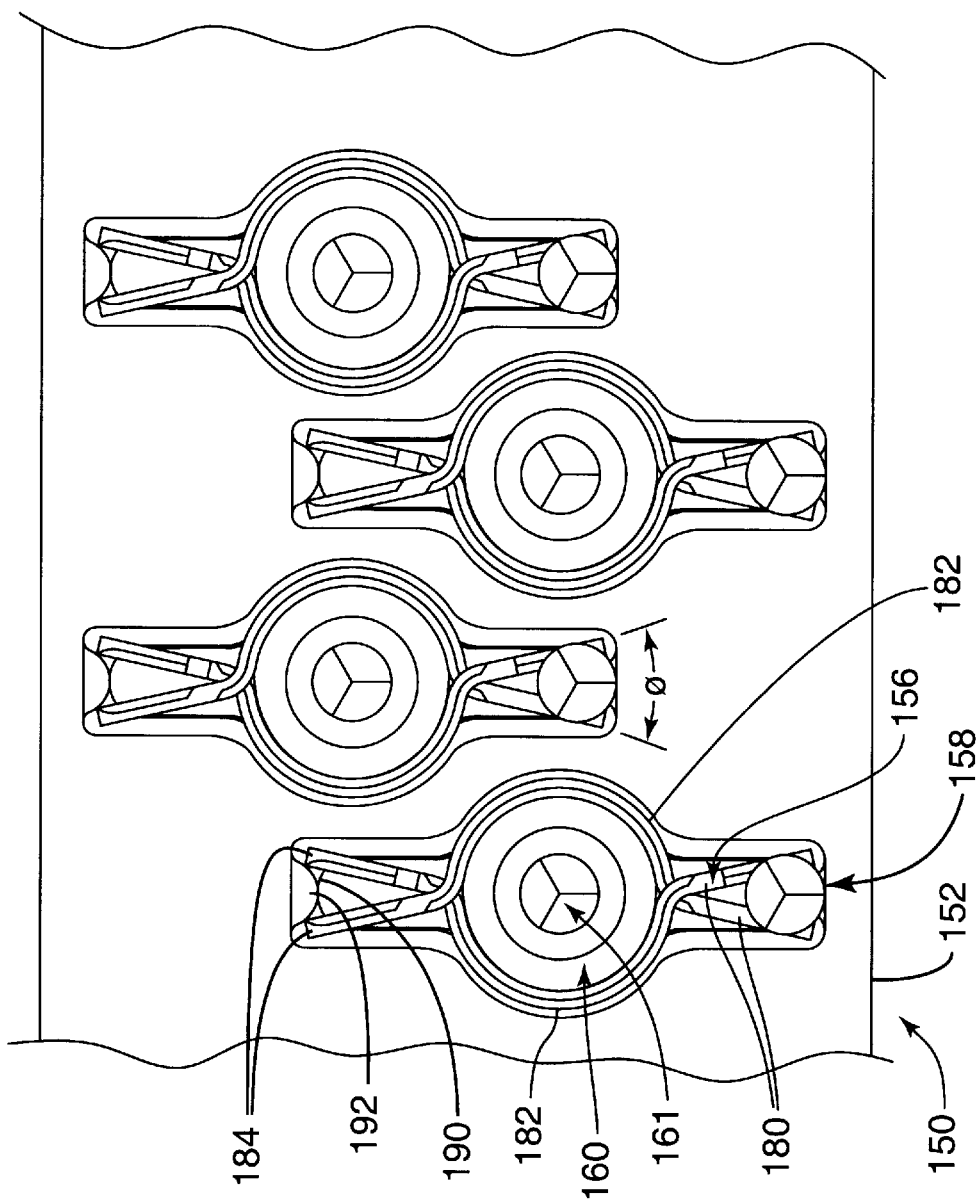
FIG. 7A is an elevational view of the front face of an alternate embodiment of the inventive spring probe block assembly described herein.

An alternate embodiment of a spring probe block assembly 150 is shown in FIG. 7A. The spring probe block assembly 150 includes an insulative housing 152, signal probe contacts 161 and ground probe contacts 158, and probe connector retainers 156. As in the first described embodiment, the housing 152 is a molded dielectric material, where the dielectric material surrounds and isolates the ground elements and associated signal line from every other signal line and ground pairing, and further insulates all grounds in the assembly from other adjacent probe block assemblies and the automated test equipment chassis ground. As described above, the cored cavities in both ends of the housing 152 conform to the general envelope of an assembled set of ground elements, with the cavities dimensioned to constrain axial and lateral movement of the assembled probe connectors and ground clamps when the spring probes are installed therein.

Figure 7B:
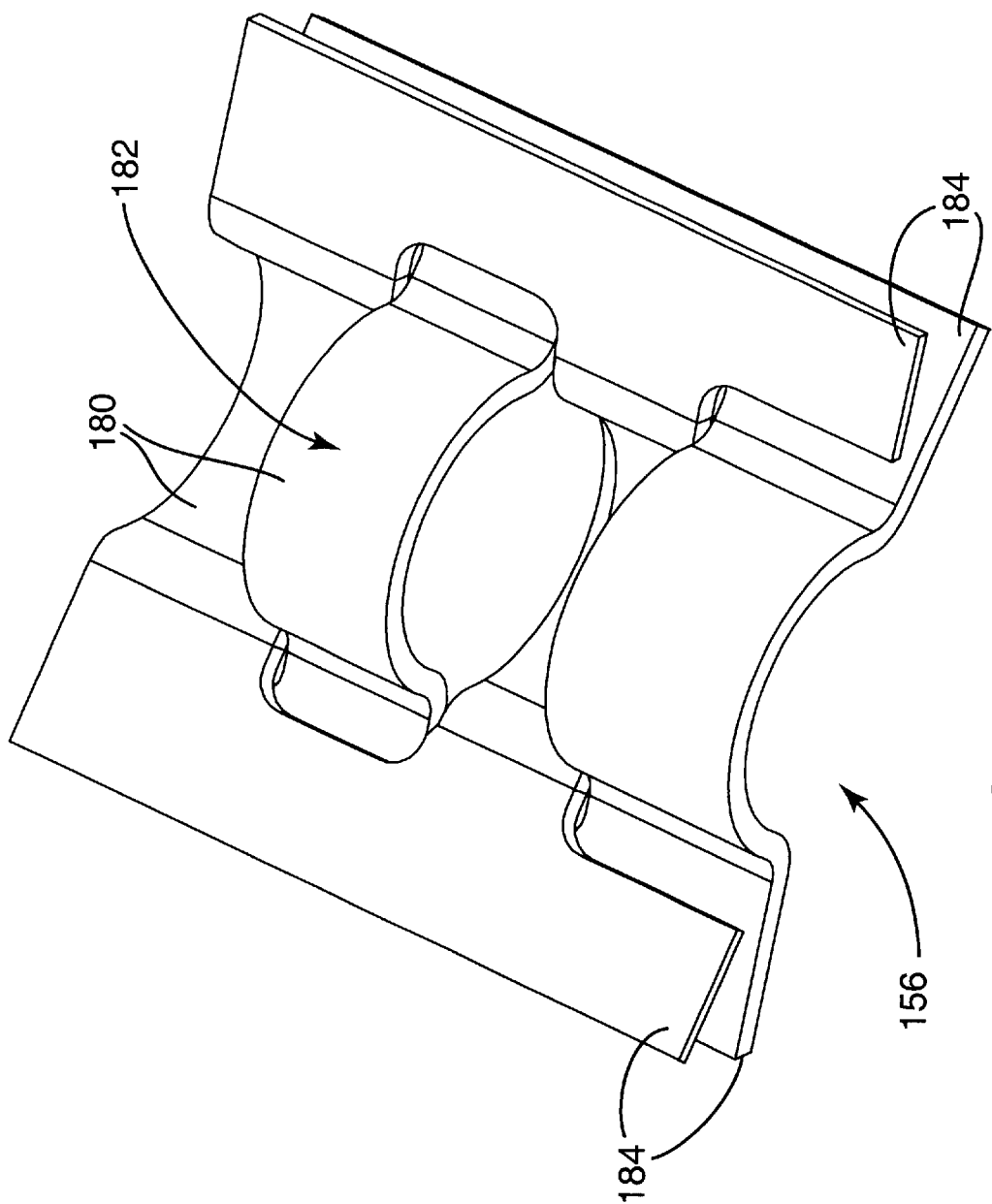
FIG. 7B is a greatly enlarged view of the conductive retainer element of FIG. 7A.

As seen in FIG. 7A and 7B, probe retainer 156 comprises a pair of stamped electrical ground clamps 180 which engage each other to form a clamping device to receive the signal probe connector 160 and ground probes 158. The ground clamps 180 have centrally located loops 182 in axial alignment and a pair of spring arms 184 extending from each of two ends. The ground clamp subassembly is preferably symmetrical, such that it may be inserted into the cavity of the housing 152 without a specific orientation, thereby increasing the ease of assembly. The loops 182 of the ground clamps 180 are sized to receive a signal spring probe connector 160 which is slidably engaged with a low insertion force (less than 7 lbs.). When ground spring probes 158 are inserted between the spring arms 184, the arms 184 are outwardly displaced and generate a normal force against the signal spring probe connector body 60, thereby retaining the assembled elements in place. Preferably, one of the loops 182 of the ground clamps 180 is located behind the press ring 183 of the signal probe connector 160, thereby improving the pullout resistance of the device.

In the embodiment of FIGS. 7A and 7B, the spring arms 184 of the ground clamps 180 are outwardly angled in a scissors-like manner such that when ground probe 158 is inserted therebetween a clamping force urges the ground probe 158 against an axial groove 190 of the housing 152, thereby establishing the proper alignment of the ground probe 158 within the housing 152. The included angle θ defined by the spring arms 184 is preferably greater than 22 degrees. In addition, the side walls of the cavity in the housing preferably support the spring arms 184 of the ground clamps 180 in a preloaded condition, such that the preload on the spring arms 184 increases the open area between the spring arms 184, thereby facilitating the insertion of the ground probe 158. Such preload also would increase the entry angle between the spring arm lead-in chamfers 192, thereby decreasing the required insertion force.

Figure 8C:
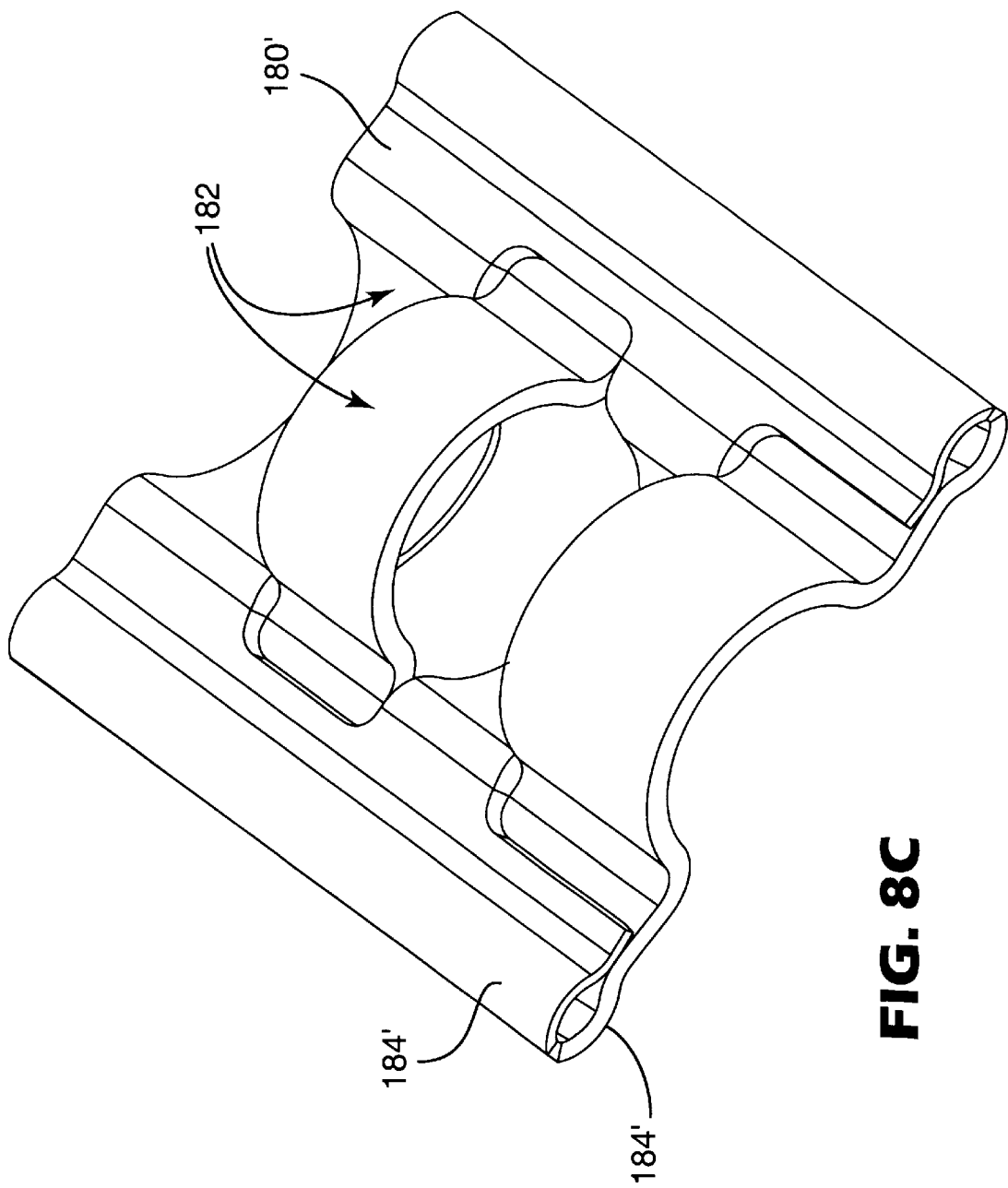
FIG. 8C is a greatly enlarged view of the conductive retainer element of FIGS. 8A and 8B.

In an alternate embodiment shown in FIGS. 8A and 8B, the spring arms 184' of the ground clamps 180' are curved back toward each other so as to substantially surround the ground probe 158 when ground probe 158 is inserted into the ground clamps 180'. When a ground probe 158 is inserted into the ground probe-receiving portion of the ground clamps 180', a clamping force tightens the ground clamps 180' about the body of signal probe connector 160. If desired, the individual ground clamps 180' may be formed with optional connecting webs which allow the simple folding of the ground clamps 180' to obtain the final orientation of the elements. The optional connecting web securing the ground clamps together may be frangible, if desired, or may be malleable.

Figure 9A:
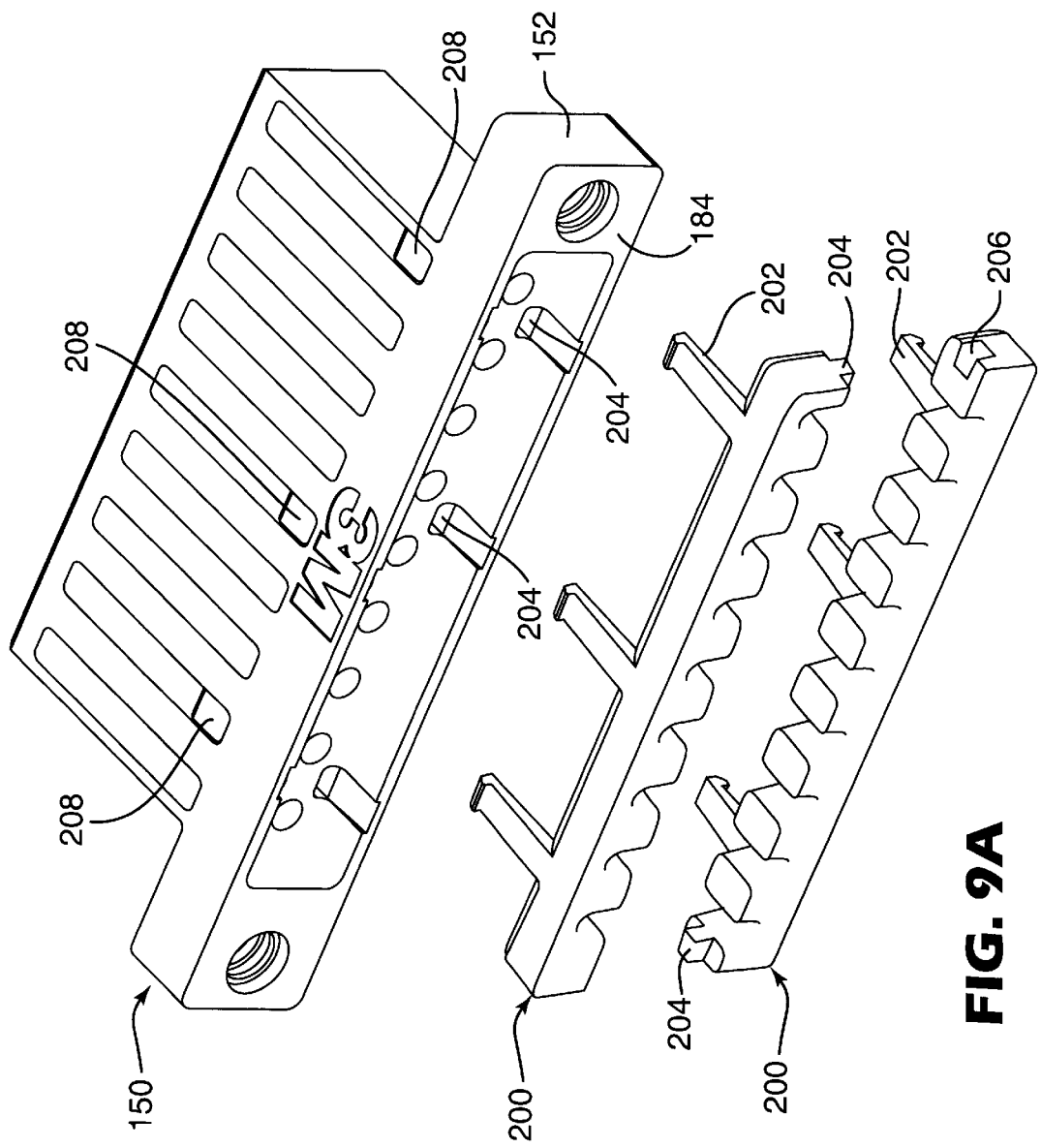
FIGS. 9A and 9B are perspective views showing retainers used in the embodiments of FIG. 7A, 8A and 8B.
Figure 9B:
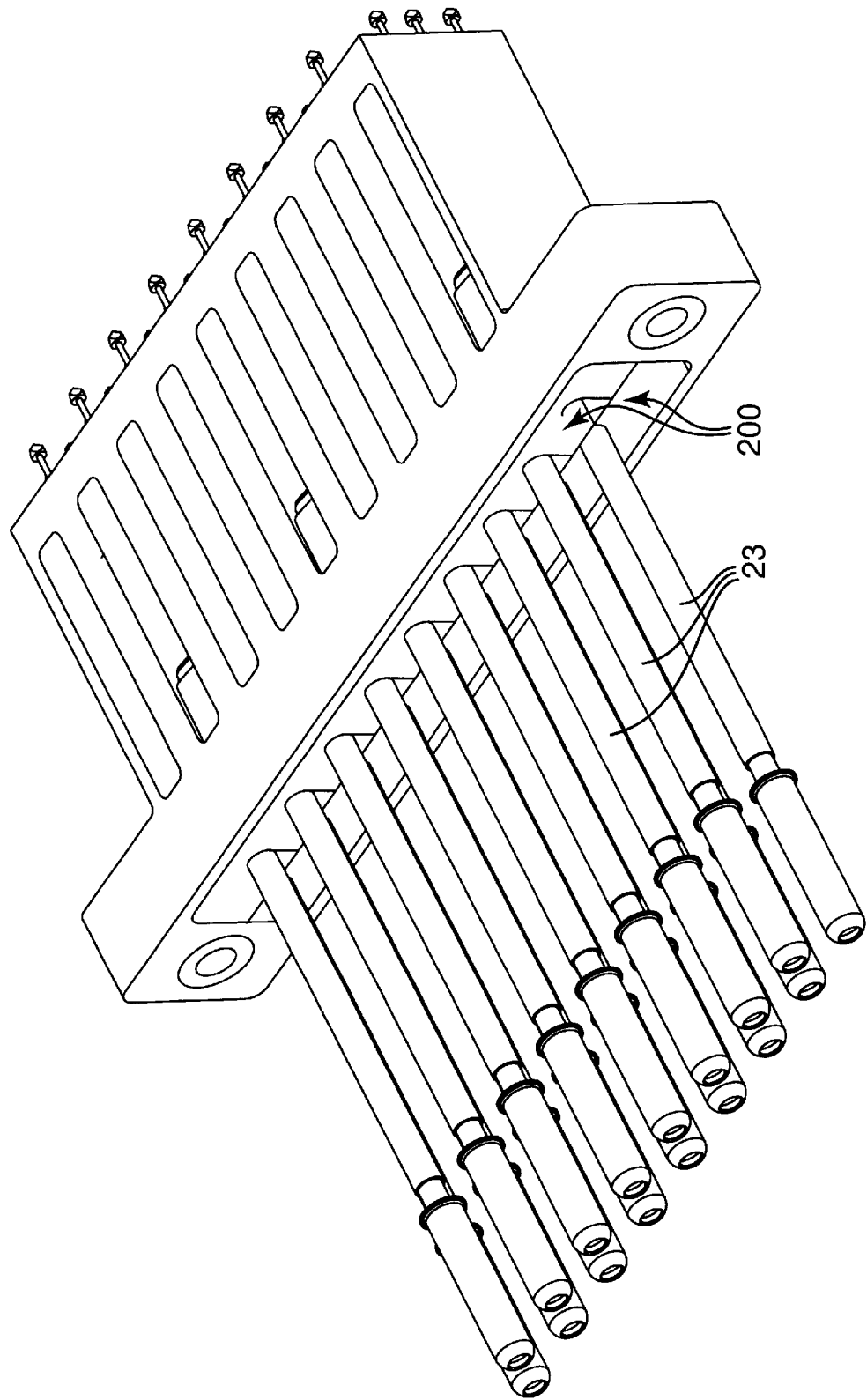

To increase the cable pullout force, retainers 200 are preferably provided which secure to the back face 184 of the housing 152 in a snap-fitting arrangement, as seen in FIGS. 9A and 9B. The retainers 200 preferably have latching arms 202 to engage reciprocal latching features 204 of the housing 152. For ease of assembly, the retainers 200 would preferably be formed as two pieces that have mating tongues 204 and grooves 206 that interlock the two retainer pieces 200 together. Further, the housing 152 would preferably have an offset cavity in the back end of the housing with respect to the pattern of cavities that accept the probe connectors, thereby allowing the use of identical retainer parts. This would reduce the cost of manufacture and increase the ease of assembly of the device. Preferably, the housing 152 would include passageways 208 that open to the latching arms 202 of the retainers 200, such that the retainers 200 may be disengaged from the outside of the housing 152 for rework on the device.

For the embodiments of the spring probe block assemblies 50, 150 described herein, those skilled in the art will recognize additions and modifications that may be made without departing from the spirit and scope of the invention. For example, the housing 52, 152 of the assembly will preferably be provided with mounting holes 210 so that the spring probe block assemblies 50, 150 may be mounted in an automated test equipment head. It is anticipated that the retainer elements (ground plates 56 and ground clamps 180, 180') may have shapes that differ from those illustrated herein, or may, for example, be used in metal probe assembly housings, yet still embody the function and spirit of the invention.

What is claimed is:

1. A spring probe block assembly comprising:

an insulative housing hating a cavity in a front face of the housing;

a probe connector in the cavity, the probe connector having a signal probe surrounded by an insulative layer and a conductive shell;

a conductive ground probe in the cavity;

a conductive retainer positioned within the cavity adjacent the front face of the housing, the retainer having passages for receiving the probe connector and the ground probe, wherein the ground probe is in electrical contact with the conductive retainer and the conductive shell of the probe connector.

2. The spring probe block assembly of claim 1, wherein the signal probe and ground probe are spring probes.

3. The spring probe block assembly of claim 1, wherein the housing is a molded dielectric material.

4. The spring probe block assembly of claim 3, wherein the dielectric material has anti-static properties.

5. The spring probe block assembly of claim 3, wherein the dielectric material has static-dissipative properties.

6. The spring probe block assembly of claim 1, wherein the housing includes a plurality of cavities, each of the plurality of cavities containing a conductive retainer, a probe connector and a ground probe.

7. The spring probe block assembly of claim 1, further comprising a second conductive ground probe in the cavity.

8. The spring probe block assembly of claim 1, wherein the conductive retainer receives the probe connector by press-fit, and wherein the conductive retainer receives the ground probe by slip-fit.

9. The spring probe block assembly of claim 1, wherein the cavity includes a ramped side wall positioned such that the ground probe is deflected by the ramped side wall to create a normal force between the ground probe and the retainer, thereby retaining the ground probe within the assembly.

10. The spring probe block assembly of claim 9, wherein the ground probe is electrically connected to the conductive shell of the signal probe.

11. The spring probe block assembly of claim 1, wherein the ground probe is disposed at an angle relative to the probe connector of three degrees or less.

12. The spring probe block assembly of claim 1, further comprising access holes in the housing, the access holes extending from an outer surface of the housing into the cavity at a point adjacent a back end of the ground probe.

13. The spring probe block assembly of claim 1, wherein the retainers are symmetrical about at least one plane.

14. The spring probe block assembly of claim 1, wherein the cavity extends through the housing from the front face of the housing to a back face of the housing.

15. The spring probe block assembly of claim 1, wherein the ground probe is in electrical contact with the conductive retainer at a point adjacent -the front face of the housing.

16. The spring probe block assembly of claim 1, wherein the probe connector is a coaxial probe connector.

17. The spring probe block assembly of claim 1, wherein the retainer is formed from metal by a method selected from one of the group of machining, extruding, casting, metal injection molding, or sintering.

18. The spring probe block assembly of claim 1, wherein the retainer is formed from stamped sheet metal.

19. The spring probe block assembly of claim 1, wherein the retainer is formed from a conductive polymer.

20. The spring probe block assembly of claim 1, wherein the retainer is formed from a plated polymer.

21. The spring probe block assembly of claim 1, wherein the probe connector is terminated to a coaxial cable adjacent the back face of the housing.

22. The spring probe block assembly of claim 1, wherein a resilient seal is positioned about the probe connector adjacent a back end of the probe connector.

23. A spring probe block assembly comprising:

a housing;

a first probe connector positioned within the housing, the first probe connector having a signal probe, an insulative layer, and a conductive shell;

a first ground probe positioned within the housing;

a first grounding portion electrically connecting the first ground probe and the conductive shell of the first probe connector;

wherein a retention force is maintained between the first grounding portion and the first ground probe by spring energy stored in the first ground probe by elastic deformation of the first ground probe.

24. The spring probe block assembly of claim 23, wherein the first grounding portion is electrically commoned with the housing.

25. The spring probe block assembly of claim 23, wherein the first grounding portion is electrically isolated from the housing.

* * * * *

UNITED STATES PATENT AND TRADEMARK OFFICE
CERTIFICATE OF CORRECTION

PATENT NO. : 6,551,126 B1
APPLICATION NO. : 09/804762
DATED : April 22, 2003
INVENTOR(S) : Steven Feldman It is certified that error appears in the above-identified patent and that said Letters Patent is hereby corrected as shown below:

Title Page
References Cited, under U.S. Patent Documents, please add:

| | | | | |
|---|---|---|---|---|
| -- US 4,593,243 | 06/03/86 | Lao et al. | 324 | 158 P |
| US 4,712,062 | 12/08/87 | Takamine | 324 | 158 F |
| US 4,724,180 | 02/09/88 | Kern | 428 | 131 |
| US 4,827,211 | 05/02/89 | Strid et al | 324 | 158 P |
| US 4,965,514 | 10/23/90 | Herrick | 324 | 158 P |
| US 5,144,228 | 09/01/92 | Sorna et al | 324 | 158 P |
| US 5,308,250 | 05/03/94 | Walz | 439 | 63 |
| US 5,416,429 | 05/16/95 | McQuade et al | 324 | 762 |
| US 5,477,159 | 12/19/95 | Hamling | 324 | 754 |
| US 5,486,770 | 01/23/96 | Johnson | 324 | 754 |
| US 5,525,911 | 06/11/96 | Marumo et al | 324 | 754 |
| US 5,625,299 | 04/29/97 | Uhling et al | 324 | 754 |
| US 5,654,647 | 08/05/97 | Uhling et al | 324 | 754 |
| US 5,917,330 | 06/29/99 | Miley | 324 | 762 |
| US 5,952,839 | 09/14/99 | Fredrickson | 324 | 754 |
| US 6,160,412 | 12/12/00 | Martel et al | 324 | 761-- |

Col. 1,
Line 11, delete "test to equipment" and insert in place thereof --test equipment--

Col. 2,
Line 53, delete "the used of" and insert in place thereof --the use of--

Col 4.,
Line 42, delete "polyphtalarnide" and insert in place thereof --polyphtalamide--

Col. 9,
Line 20, delete "housing hating" and insert in place thereof --housing having--

UNITED STATES PATENT AND TRADEMARK OFFICE
CERTIFICATE OF CORRECTION

PATENT NO. : 6,551,126 B1
APPLICATION NO. : 09/804762
DATED : April 22, 2003
INVENTOR(S) : Steven Feldman It is certified that error appears in the above-identified patent and that said Letters Patent is hereby corrected as shown below:

Col. 10,
Line 17, delete "adjacent -the" and insert in place thereof --adjacent the--

Signed and Sealed this

Twenty-seventh Day of November, 2007

JON W. DUDAS
*Director of the United States Patent and Trademark Office*